United States Patent [19]

Müller

[11] Patent Number: 5,184,102
[45] Date of Patent: Feb. 2, 1993

[54] HOUSING FOR AN ELECTROMECHANICAL COMPONENT, PARTICULARLY FOR A RELAY

[75] Inventor: Erwin Müller, Munich, Fed. Rep. of Germany

[73] Assignee: Siemens Aktiengesellschaft, Munich, Fed. Rep. of Germany

[21] Appl. No.: 730,929
[22] PCT Filed: Apr. 27, 1989
[86] PCT No.: PCT/DE89/00268
 § 371 Date: Jul. 17, 1991
 § 102(e) Date: Jul. 17, 1991
[87] PCT Pub. No.: WO90/08393
 PCT Pub. Date: Jul. 26, 1990

[30] Foreign Application Priority Data

Jan. 17, 1989 [DE] Fed. Rep. of Germany ....... 8900466

[51] Int. Cl.⁵ ............................................. H01H 9/02
[52] U.S. Cl. ...................................... 335/202; 335/128
[58] Field of Search .......................... 335/202, 78-85, 335/128, 131; 200/295-306

[56] References Cited

U.S. PATENT DOCUMENTS

| 4,631,631 | 12/1986 | Hodges et al. | 361/306 |
| 4,675,987 | 6/1987 | Minks et al. | 29/602.1 |
| 5,051,540 | 9/1991 | Schroeder | 174/523 |

FOREIGN PATENT DOCUMENTS

| 1233931 | 2/1967 | Fed. Rep. of Germany . |
| 8017121 | 6/1980 | Fed. Rep. of Germany . |
| G8703079.9 | 5/1987 | Fed. Rep. of Germany . |

Primary Examiner—Lincoln Donovan

[57] ABSTRACT

The housing has a severable projection (3) at a housing wall in which projection a channel (33, 34) extends proceeding from the interior. The channel has at least two sections (33, 34) having different cross sections that become smaller from inside toward the outside in steps. As a result thereof, an aeration opening of differing sizes can be created for different applications of the component by parting the peg at different locations.

12 Claims, 1 Drawing Sheet

HOUSING FOR AN ELECTROMECHANICAL COMPONENT, PARTICULARLY FOR A RELAY

BACKGROUND OF THE INVENTION

1. Field of the Invention

The invention is directed to a housing for an electromechanical component, particularly for a relay, comprising a housing wall tightly terminating a gas-filled interior, whereby the housing wall forms a severable projection toward the outside into which a channel extends proceeding from the interior.

2. Description of the Related Art

In electromechanical components such as relays, there is often the demand that they must be tight for soldering onto printed circuit boards in order to avoid the penetration of liquid cleaning and soldering agents as well as of vapors. To this end, the housing is usually closed with casting compound at the terminals side, as a result whereof the feed throughs for the terminal pins and the gaps between the base and cap are closed. It has proven expedient, however, to provide such a housing having plastic encapsulation with an aeration opening for further utilization after the soldering in order to prevent the creation of a contactdamaging microclimate in the interior of the housing. This microclimate, for example, is influenced by inadequate heat elimination when switching higher currents.

To this end, it is known from, for example, DE-U-80 17 121 to apply a projection in the form of a hollow cone or cylinder to a housing cap of a relay. This projection is cut off with a tool after the relay is soldered in, as a result whereof the channel extending from the interior of the housing into the projection is opened up. The cross section of the aeration opening is prescribed by the channel cross section at the defined parting location. When, thus, the relay should experience differing aeration for different applications and different switching loads, this must be taken into consideration from the very outset by different housing caps with correspondingly differently shaped projections.

Given components such as relays having a large gas volume in the housing, on the other hand, there is the problem that an over-pressure arises when sealing the housing with warm casting compound and when curing this casting compound, this over-pressure leading either to pores at the seal locations or potentially causing a bulging of the housing cap. In order to avoid this effect, it is likewise already known to provide an aeration hole in the housing for the main sealing process, this being subsequently closed by thermal deformation or by applying a drop of resin in case a complete termination of the housing is desirable for soldering or for later employment as well. Such closable aeration holes that can also be accommodated in a peg were hitherto respectively provided in a different form and independently of the afore-mentioned, hollow housing projections for subsequent aeration.

SUMMARY OF THE INVENTION

It is an object of the invention to create a housing for an electromechanical component, particularly for a relay, whereby a housing projection provided with an aeration channel can be employed in a single embodiment thereof both for an aeration when sealing as well as for an aeration after the soldering, whereby the degree of aeration can also be differently selected corresponding to the application and to the switching load.

In a housing of the species initially cited, this object is inventively achieved in that the channel in the projection has at least two sections having different cross sections that become smaller in steps from inside to outside. The outside section of the channel comprising a smaller cross section can thereby comprise an entirely or partially closed cross-wall in the form of, for instance, an injected skin. This cross-wall can be provided in a known way as terminating wall at the end of the projection; however, it can also be provided at approximately mid-height of the outer channel section having a smaller cross section. This is especially advantageous when the cross-wall has a small aeration hole for the main sealing process of the housing, this to be subsequently closed. In this case, the cross-wall comprising the aeration hole together with that part of the appertaining channel section open toward the outside forms a drip-on trough into which a resin drop can be introduced for subsequently sealing the aeration hole. Since this channel section in turn expands at the inside of the cross-wall, it forms a capillary block that prevents the resin drop from flowing into the interior of the housing.

The projection of the housing also expediently has its outside contours matched to the graduated cross section of the inwardly disposed channel. Where the smaller channel cross section begins can thus also be recognized from the outside. One can thus easily see where the projection is to be cut off in order to expose either a large or a small aeration hole. The projection can thereby have the shape of a graduated peg that is provided in a housing part set back step-shaped, so that the peg does not project beyond the general housing contour. The projection, however, can also be provided in the form of a rib fashioned graduated, for example as an improvement of the rib at a housing corner disclosed in DE-U-87 03 079.

The invention shall be set forth in greater detail below with reference to an exemplary embodiment on the basis of the drawing. Shown are:

DETAILED DESCRIPTION OF THE PREFERRED EMBODIMENTS

Figure 1:
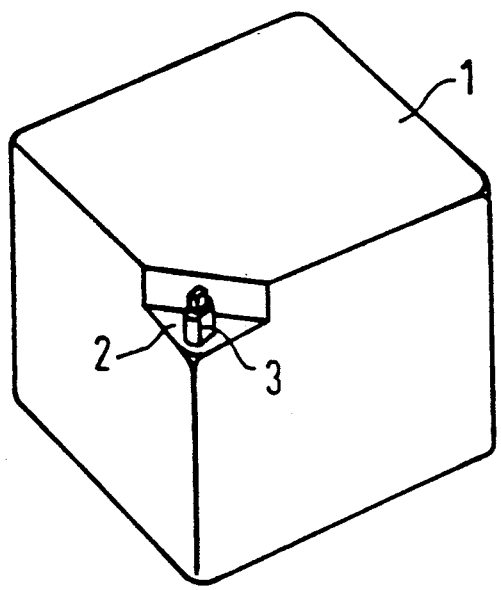
FIG. 1 a cuboid relay housing having a projection in the form of a peg fashioned graduated.

The relay housing shown in FIG. 1 is essentially composed of a cap that is put in place on a base member, for instance a pedestal, that cannot be seen. For example, terminal pins can outwardly emerge in this base member. The feed throughs of the terminal pins and the gaps between the cap and the base member are sealed in a known way, this not needing to be shown and described in greater detail here.

At its upper corners, the cap 1 has a set-back step 2 on which a projection in the form of a graduated peg 3 is arranged such that it does not project beyond the cuboid contour of the housing 1.

Figure 2:
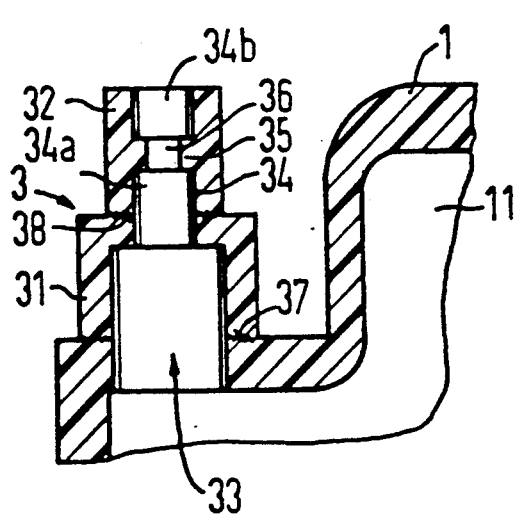
FIG. 2 an enlarged cross section through the peg of FIG. 1.
Figure 3:
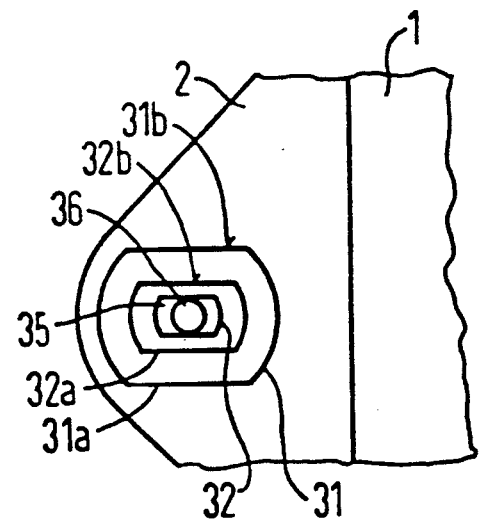
FIG. 3 an enlarged plan view onto the peg of FIG. 1.

The specific fashioning of the peg 3 may be seen in the sectional view of FIG. 2 and in the plan view of FIG. 3. In accord therewith, the peg 3 is fashioned both inwardly as well as outwardly graduated, so that a first section 31 having a larger cross section and a second section 32 having a smaller cross section are formed, whereby the section 31 is seated immediately on the step 2 of the housing 1, whereas the section 32 forms the free end of the peg 3. Of course, additional graduations could also be provided as needed.

The peg 3 is hollow and thus forms an aeration channel that is in communication with the interior 11 of the housing. A channel section 33 having a large cross section lies in the region of the section 31, whereas a channel section 34 that likewise has a diminished cross section lies in the region of the peg section 32. The channel section 34 is also subdivided into two sub-sections 34a and 34b by a cross-wall 34 that can be fashioned as an injected skin, whereby the cross-wall 35 in the present example again has a central aeration hole 36. Dependent on the application, this aeration hole 36 can be provided in the cross-wall 34 from the very start or can be punched through later. It usually serves the purpose of enabling a pressure compensation while the housing 1 is being sealed with casting compound. When this aeration hole 36 is to be closed later, then, for example, a resin drop can be introduced from above into the sub-section 34b that thus serves as a drip-on trough. The widening of the channel cross section below the cross-wall 35 acts as a capillary block, so that the resin drop does not penetrate into the sub-section 34a or farther into the housing.

When the housing is to be aerated after, for instance, the component is soldered onto a printed circuit board, then either the section 32 or the entire peg having the sections 31 and 32 can be removed as needed. This can occur, for example, in that the appertaining peg section is turned with a tool and then breaks off at the break surface 37 or at the break surface 38. An aeration opening having the cross section of the channel section 34 or having the cross section of the channel section 32 is correspondingly opened.

The contours of the peg 3 seen from above are shown in FIG. 3. In the present example, the cylindrical cross sections at the opposite sides 31a and 31b or, respectively, 32a and 32b are flattened. The peg can thus be more easily grasped with a pliers or with a socket wrench and can be more easily sheared off by turning.

The channel sections in the peg 3 can be executed round, oblong-like or angularly. The illustrated fashioning in the upper part enables, first, a support of the male mold in the injection molding form and, thus, enables a longer useful life and greater stability of this form; on the other hand, the centrally disposed cross-wall 35 yields a reinforcement that facilitates the described shearing of the peg.

The step-shaped projection, of course, can also comprise any other shape and can be attached at other locations of the housing. For example, it would be conceivable to provide a beveling corresponding to DE-U-87 03 079 instead of the step 2 in the housing and to fashion the projection as a peg or as a graduated rib on this beveling.

Although other modifications and changes may be suggested by those skilled in the art, it is the intention of the inventors to embody within the patent warranted hereon all changes and modifications as reasonably and properly come within the scope of their contribution to the art.

I claim:

1. A housing for an electromechanical component, comprising:

a housing wall that tightly terminates a gas-filled interior, said housing wall including a severable projection extending outwardly of said housing wall into which a channel extends proceeding from the interior of said housing wall, said channel in the projection has at least two sections having different cross sections that become smaller from inside toward outside of said housing wall in steps; and a cross-wall in an outer section of said two sections of the channel, said outer section being of a smaller cross section than an inner section of said two sections.

2. A housing according to claim 1, wherein said cross-wall is at approximately mid-height of the outer section of said channel.

3. A housing according to claim 2, wherein the cross-wall defines an aeration hole.

4. A housing for an electromechanical component, comprising:

a housing wall that tightly terminates a gas-filled interior, said housing wall including a severable projection extending outwardly of aid housing wall into which a channel extends proceeding from the interior of said housing wall, said channel in the projection has at least two sections having different cross sections that become smaller from inside toward outside of said housing wall in steps; and an outside contour of said severable projection being shaped to indicate changes in the cross section of the channel.

5. A housing for an electromechanical component, comprising:

a housing wall that tightly terminates a gas-filled interior, said housing wall including a severable projection extending outwardly of said housing wall into which a channel extends proceeding rom the interior of said housing wall, said channel in the projection has at least two sections having different cross sections that become smaller from inside toward outside of said housing wall in steps, and said housing wall having a housing part that includes a sep-like set back and said projection being a peg on said housing part.

6. A housing according to claim 5, wherein an outside contour of every section of said peg is in the form of a cylinder flattened at two opposite sides.

7. A housing for an electromechanical component, comprising:

a housing wall that tightly terminates a gas-filled interior, said housing wall including a severable projection extending outwardly of said housing wall into which a channel extends proceeding from the interior of said housing wall, said channel in the projection has at least two sections having different cross sections that become smaller from inside toward outside of said housing wall in steps, said projection being a graduated rib at a housing corner of said housing wall.

8. A housing according to claim 1, wherein said cross-wall is partially closed.

9. A housing according to claim 1, wherein said cross-wall is entirely closed.

10. A housing for an electrical component having electrical contacts mountable within the housing, comprising:

a housing wall defining an interior space for receiving the electrical component;

a projection extending from said housing wall, said projection including a passageway extending at least partially through said projection from the interior space defined by said housing wall, said passageway having a first portion of a lesser cross section and a second portion of a greater cross section, said second portion of said passageway being closer to said interior space than said first portion, said projection having an shaped external surface indicative of where said first portion of said passageway meets said second portion of said passageway so that said projection may selectively be cut at said first portion or at said second portion.

11. A housing as claimed in claim 10, further comprising:
a cross-wall in said first portion of said passageway reducing the cross section of said first portion at said cross-wall.

12. A housing as claimed in claim 15, wherein said housing wall includes a step-shaped set back at one corner of said housing wall, and
wherein said projection is in said step-shaped set back so as not to project beyond a general housing contour of said housing wall.

* * * * *